United States Patent
Huang (10) Patent No.: US 12,468,219 B2
(45) Date of Patent: Nov. 11, 2025

(54) METHOD FOR FORMING PHOTOMASK

(71) Applicant: United Microelectronics Corp., Hsinchu (TW)

(72) Inventor: Pin Han Huang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 697 days.

(21) Appl. No.: 17/873,165

(22) Filed: Jul. 26, 2022

(65) Prior Publication Data

US 2023/0408900 A1    Dec. 21, 2023

(30) Foreign Application Priority Data

Jun. 20, 2022  (TW) .................................. 111122798

(51) Int. Cl.
*G03F 1/36* (2012.01)
*G03F 1/70* (2012.01)
*G03F 7/00* (2006.01)

(52) U.S. Cl.
CPC .................. *G03F 1/36* (2013.01); *G03F 1/70* (2013.01); *G03F 7/705* (2013.01)

(58) Field of Classification Search
CPC ... G03F 1/36; G03F 7/705; G03F 1/70; G03F 7/70441; G03F 7/70433
See application file for complete search history.

(56) References Cited

U.S. PATENT DOCUMENTS

| | | | |
|---|---|---|---|
| 8,146,026 B2 | 3/2012 | Agarwal et al. | |
| 8,495,530 B2 | 7/2013 | Agarwal | |
| 8,832,610 B2 | 9/2014 | Ye et al. | |
| 9,500,945 B1* | 11/2016 | Ning | G06F 30/30 |
| 2016/0246168 A1 | 8/2016 | Ye et al. | |
| 2018/0173090 A1* | 6/2018 | Wang | G03F 1/36 |
| 2022/0137503 A1* | 5/2022 | Tao | G03F 7/70441 |
| | | | 716/53 |
| 2023/0100578 A1* | 3/2023 | Cao | G03F 7/705 |
| | | | 716/53 |

FOREIGN PATENT DOCUMENTS

| | | |
|---|---|---|
| TW | 201619690 | 6/2016 |
| TW | 202203297 | 1/2022 |
| TW | 202223547 | 6/2022 |

OTHER PUBLICATIONS

"Office Action of Taiwan Counterpart Application", issued on Mar. 18, 2025, p. 1-p. 5.

* cited by examiner

*Primary Examiner* — Stewart A Fraser
(74) *Attorney, Agent, or Firm* — JCIPRNET (57) ABSTRACT

A method for forming a photomask is provided. The method includes: providing a photomask pattern for a target pattern; obtaining a first light intensity curve according to the photomask pattern by simulation; subjecting the first light intensity curve to a check on light intensities at pattern edges of the target pattern to define a light intensity error; retargeting the photomask pattern to reduce the light intensity error; identifying a lithography weak region in the target pattern; obtaining a second light intensity curve of the lithography weak region by simulation; subjecting the second light intensity curve to a check on a peak light intensity to define a peak intensity error; retargeting the target pattern to reduce the peak intensity error; and retargeting the photomask pattern again based on the modified target pattern.

14 Claims, 8 Drawing Sheets

METHOD FOR FORMING PHOTOMASK

CROSS-REFERENCE TO RELATED APPLICATION

This application claims the priority benefit of Taiwan application serial no. 111122798, filed on Jun. 20, 2022. The entirety of the above-mentioned patent application is hereby incorporated by reference herein and made a part of this specification.

BACKGROUND

Technology Field

The disclosure relates to a lithography process, and particularly, to a method for forming a photomask.

Description of Related Art

As feature sizes of integrated circuits have shrunk continuously and almost reach physical limits of exposure system, a pattern transfer from a photomask to a wafer is distorted due to optical proximity effect. Application of optical proximity correction (OPC) techniques to design photomask patterns is one way to reduce the transfer distortion.

However, as patterns of integrated circuits become more complex, the issue of transfer distortion may not be effectively solved simply by using OPC techniques. Generally, after a photomask is designed via using the OPC techniques, transfer distortion regions in the photomask pattern (or referred to lithography weak regions) requires local repairments. The finalized photomask pattern can be output after many times of time-consuming repairments and verifications. Consequently, semiconductor manufacturing process is greatly extended and manufacturing cost is increased.

SUMMARY

The disclosure provides a method for forming a photomask capable of effectively solving the problem of transfer distortion and preventing a step of lengthy photomask repair. In an aspect of the disclosure, a method for forming a photomask is provided. The method comprises: providing a photomask pattern according to a target pattern; simulating a first light intensity curve according to the photomask pattern; subjecting the first light intensity curve to a check on light intensities at pattern edges of the target pattern to define a light intensity error, wherein the light intensity error is a difference between the light intensities of the first light intensity curve corresponding to the pattern edges of the target pattern and a predefined standard light intensity; correcting the photomask pattern to reduce the light intensity error; identifying a lithography weak region in the target pattern; obtaining a second light intensity curve of the lithography weak region by simulation; subjecting the second light intensity curve to a check on peak light intensity to define a peak intensity error, wherein the peak intensity error is a difference between a peak value of the second light intensity curve and a predetermined peak value; retargeting the target pattern to reduce the peak intensity error; and re-correcting the photomask pattern according to the retargeted target pattern.

In some embodiments, the method for forming the mask further comprises: repeatedly performing a cycle including steps of simulating the first light intensity curve, performing the check on the light intensities at the pattern edges of the target pattern, correcting the photomask pattern to reduce the light intensity error, identifying the lithography weak region in the target pattern, obtaining the second light intensity curve by simulation, performing the check on peak light intensity, retargeting the target pattern to reduce the peak intensity error, and re-correcting the photomask pattern according to the retargeted target pattern until the light intensity error and the peak intensity error are eliminated.

In some embodiments, the method for forming the photomask further comprises: outputting the photomask pattern after repeatedly performing the cycle until the light intensity error and the peak intensity error are eliminated.

In some embodiments, the method for forming the photomask further comprises: retargeting the target pattern based on pre-established rules before performing the cycle for multiple times.

In some embodiments, the step of retargeting the target pattern in each cycle comprises altering a displacement amount of the target pattern based on the retargeting of the target pattern in a previous cycle.

In some embodiments, the lithography weak region in the target pattern is identified based on pre-established rules.

In some embodiments, the lithography weak region comprises a pattern in the target pattern having a width less than a predetermined width or a region between adjacent patterns in the target pattern that has a spacing width less than a predetermined spacing width.

In some embodiments, obtaining the second light intensity curve of the lithography weak region by simulation comprises: setting a simulation grid in the lithography weak region; and obtaining light intensities at simulation points defined by intersections of vertical lines and horizontal lines of the simulation grid by simulation.

In some embodiments, the target pattern is retargeted and the photomask pattern is corrected according to the retargeted target pattern so that the second light intensity curve is moved upward or downward.

In some embodiments, retargeting the target pattern to reduce the peak intensity error is a model-based target pattern retargeting.

In another aspect of the disclosure, a method for forming a photomask is provided. The method comprises: performing a cycle for many times, wherein each cycle comprises performing a model-based photomask correction and a model-based target pattern retargeting, the model-based target pattern retargeting comprises performing a check on a peak light intensity of a simulated light intensity curve for a lithography weak region in the target pattern, the check on the peak light intensity defines a peak intensity error, the peak intensity error is a difference between a peak value of the light intensity curve and a predetermined peak value, and the model-based target pattern retargeting results in a reduction of the peak intensity error.

In some embodiments, the model-based photomask correction is performed in each cycle such that a photomask pattern designed for the target pattern is corrected to have each part being matched with a corresponding contour of the target pattern in terms of lithography.

In some embodiments, the photomask pattern is no longer repaired for eliminating the lithography weak region after performing the cycle for multiple times.

In some embodiments, the model-based target pattern retargeting is performed to solve a problem of the lithography weak region caused by a pattern width in the target pattern being less than a predetermined width and/or a spacing between adjacent patterns being less than a predetermined spacing width.

In summary, in the embodiments of the disclosure, a method for forming a photomask is provided. In the method, an OPC iterations each including a model-based photomask pattern correction and a model-based target pattern adjustment is performed. The model-based photomask pattern correction is used for ensuring each part of the photomask pattern to be individually matched with the corresponding contour of the target pattern (on target). On the other hand, the model-based target pattern adjustment is used to solve the problem of lithography weak region caused by adjacent target patterns being too close together or the target pattern width being too narrow. As a result, the photomask repair after the OPC iterations to resolve the problem of lithography weak region is no longer required. In addition, the model-based target pattern adjustment is to correct the target pattern according to the difference between the peak value of the simulated light intensity curve of the lithography weak region and the predetermined peak value. Accordingly, the model-based target pattern adjustment can be accomplished by computer simulation and is aimed at the local lithography weak region in the target patterns rather than the entire target patterns. Therefore, the time required for designing the photomask can be greatly shortened.

DESCRIPTION OF THE EMBODIMENTS

The disclosure relates to photolithography (hereinafter referred to as lithography) technology in semiconductor manufacturing processes. When the lithography is performed, an incident light is patterned by a photomask. This patterned light is projected onto a wafer coated with a photosensitive material (e.g., a photoresist), by a series of optical elements. The photosensitive material is exposed to the patterned light, and exposed portions would be modified. Specifically, the exposed portions and masked portions of the photosensitive material have a difference in solubility with respect to a developer. When in contact with the developer, either the exposed portions or the masked portions of the photosensitive material dissolve in the developer, while the other remains. Accordingly, the photosensitive material is partially removed and thus patterned. The patterned photosensitive material can be used as a mask for a subsequent etching process, such that a material layer lying below the photosensitive material can be patterned. During semiconductor manufacturing, the lithography process is repeatedly performed to form multiple layers of patterned material on a wafer.

In various embodiments of the disclosure, a method for forming a photomask is provided. The method can greatly reduce the time required for designing a photomask capable of eliminating lithography weak regions. As will be described in greater details, the method for forming the photomask includes OPC iterations that incorporate steps of retargeting, thereby preventing the step of lengthy photomask repair.

Figure 1:
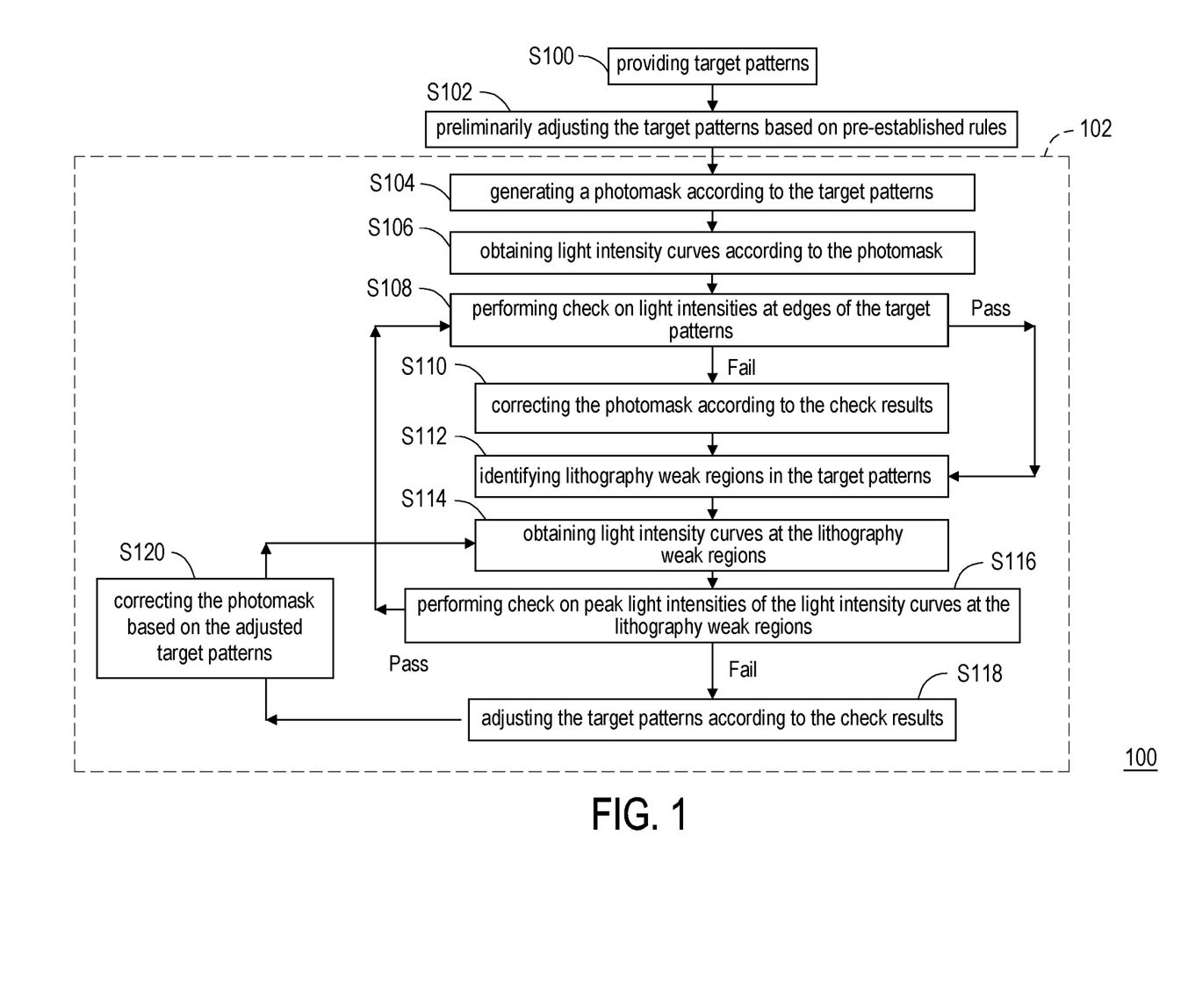
FIG. 1 is a flowchart illustrating a method for forming a photomask according to some embodiments of the disclosure.

FIG. 1 is a flowchart illustrating a method 100 for forming a photomask according to some embodiments of the disclosure.

Referring to FIG. 1, at an operation S100, target patterns are provided. The target patterns refer to patterns to be transferred onto a wafer, and can be a design drawing. In some embodiments, the target patterns may be provided in a graphic database system (GDS) format. Alternatively, the target patterns may be provided in any other suitable format.

At an operation S102, a rule-based pre-retargeting is performed to preliminarily adjust the target patterns based on the pre-established rules. In subsequent steps, the photomask pattern may be designed based on the adjusted target patterns. In the current step, pre-established rules can be used to initially identify lithography weak regions in the target pattern that may cause the designed photomask pattern to fail to be successfully transferred to the wafer. After identifying such lithography weak regions, a preliminary retargeting is performed on the target patterns according to the pre-established rules. For example, means of the retargeting may include retracting the pattern contour, extrapolating the pattern contour, adding auxiliary patterns, etc. for different types of problems. Furthermore, before the preliminarily retargeting, a contour of each target pattern may be equally divided into multiple line segments. Then, the target patterns can be adjusted in units of the line segments.

Next, OPC iterations 102 are performed. At an operation S104 in one of the OPC iterations 102, a photomask pattern is provided according to the target pattern. At present (the first OPC iteration 102), the target pattern may be the target pattern preliminarily adjusted at operation S102. This preliminarily adjusted target pattern can be used as an input to OPC to generate a photomask pattern. The resulted photomask pattern may be a preliminary photomask pattern that will be subjected to further corrections.

Figure 2A:
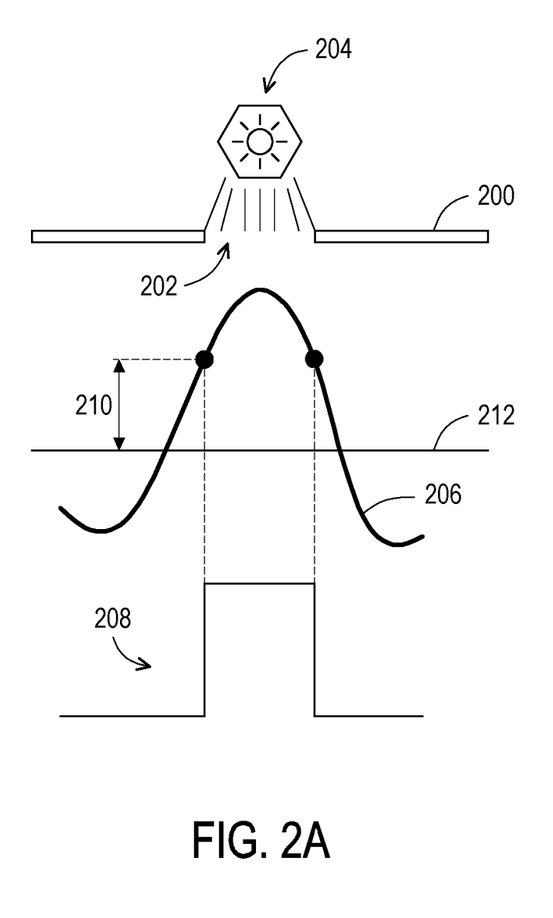
FIG. 2A illustrates a computer-simulated light intensity curve based on an opening of a photomask pattern corresponding to a part of a target pattern and an imaginary light source according to some embodiments.

At a next operation S106, a light intensity curve is obtained according to the photomask pattern. FIG. 2A illustrates a light intensity curve 206 obtained by computer simulation based on an opening 202 of a photomask pattern 200 and an imaginary light source 204, according to some embodiments. The light emitted by the light source 204 is patterned after passing through the openings 202 of the photomask pattern 200, and the light intensity curve 206 is obtained according to the patterned light. Ordinates of the light intensity curve 206 represent simulated light intensity values, and abscissas indicate positions of the corresponding light intensity values. FIG. 2A also illustrates a portion of the target patterns corresponding to the opening 202 of the photomask pattern 200 (hereinafter referred to as a target pattern 208). As shown in FIG. 2A, a peak of the light intensity curve 206 may correspond to the opening 202 of the photomask pattern 200 and the target pattern 208, and its width is approximately a width between the opposite sides of the opening 202 and a width between the opposite sides of the target pattern 208.

At an operation S108, a check on light intensity at the edges of the target pattern is performed on the light intensity curve. In an example of the light intensity curve 206 shown in FIG. 2A, performing the check includes defining an intensity error 210 corresponding to two opposite edges of the target pattern 208. In an ideal situation (i.e., the photomask pattern 200 can be used to transfer the target pattern 208 without distortion), the light intensities at the two opposite edges of the target pattern 208 match a standard light intensity 212. However, the light intensities corresponding to the two opposite edges of the current target pattern 208 (i.e., the intersections of the light intensity curve 206 and the dotted lines extending upward from the edges of the target pattern 208 in FIG. 2A) may be actually higher than the standard light intensity 212. The difference between the actual light intensities and the standard light intensity 212 is defined as the light intensity error 210. The light intensity error 210 may indicate a difference between a width of the opening 202 of the photomask pattern 200 and an ideal value.

Figure 2B:
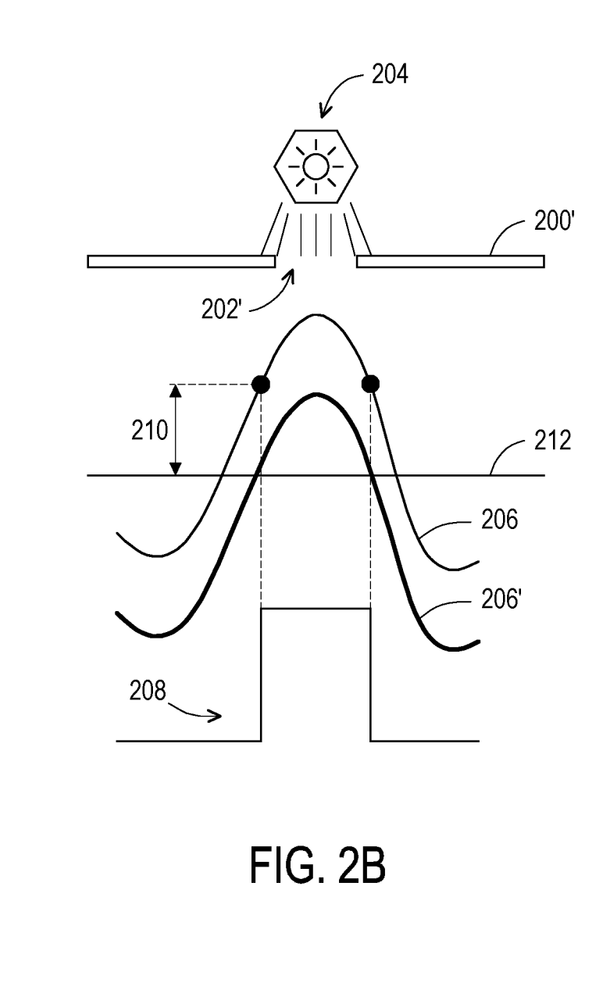
FIG. 2B illustrates a light intensity curve when the opening of the photomask shown in FIG. 2A is narrowed.

If the light intensity error is observed, the photomask pattern is corrected according to the check result in the operation S110, to eliminate the light intensity error. Since the corrections of the photomask pattern is based on the simulation result, it is a model-based photomask pattern correction. Taking FIG. 2A as an example, the actual light intensities corresponding to the two opposite edges of the target pattern 208 are higher than the standard light intensity 212 by the difference of the light intensity error 210. For this, the opening 202 of the photomask pattern 200 can be narrowed. Accordingly, the first light intensity curve 206 can be moved downward, and the light intensity error 210 can be reduced or eliminated. FIG. 2B illustrates a simulated light intensity curve 206' based on a photomask pattern 200' (with a narrowed openings 202') and the imaginary light source 204. As shown in FIG. 2B, the photomask pattern 200 shown in FIG. 2A is corrected to be the photomask pattern 200' with the narrower openings 202', which causes the first light intensity curve 206 to be moved down to be the first light intensity curve 206'. Meanwhile, the light intensities corresponding to the two opposite edges of the target pattern 208 (i.e., the intersections of the first light intensity curve 206' and the dotted lines extending upward from the two opposite edges of the target pattern 208 in FIG. 2B) are substantially leveled with the standard light intensity 212. Accordingly, the light intensity error is close to or equal to zero.

In general, multiple corrections to the photomask pattern are required to eliminate light intensity errors. As will be described with reference to following operations, the check on light intensity at the pattern edges (the operation S108) and the photomask pattern correction (operation S110) may be repeated until the light intensity error is fully eliminated. On the other hand, if the check on light intensity at the edges of the target pattern is passed (i.e., there is no light intensity error 210 shown in FIG. 2B), the operation S110 may be skipped after the operation S108 is performed.

FIG. 2A and FIG. 2B only illustrate the OPC processing for a portion of the target patterns. It can be understood that the OPC processing is actually performed on the entire target patterns, so that each opening of the photomask pattern is corrected to be matched with (in terms of pattern transfer) the corresponding contour of the target patterns, which is also referred to as being "on target". However, the OPC process may not take into account factors such as a spacing between adjacent patterns in the target patterns, a width between opposite sides of an individual pattern of the target patterns, and the like. Therefore, even with the corrected photomask, there may still be lithograph weak regions (or referred to as lithography hot spots), such as too narrow spacing between adjacent ones of the target patterns and/or too narrow pattern width in individual ones of the target patterns, and the like. As will be discussed, further retargeting may be performed to eliminate the lithography hot spots.

Figure 3A:
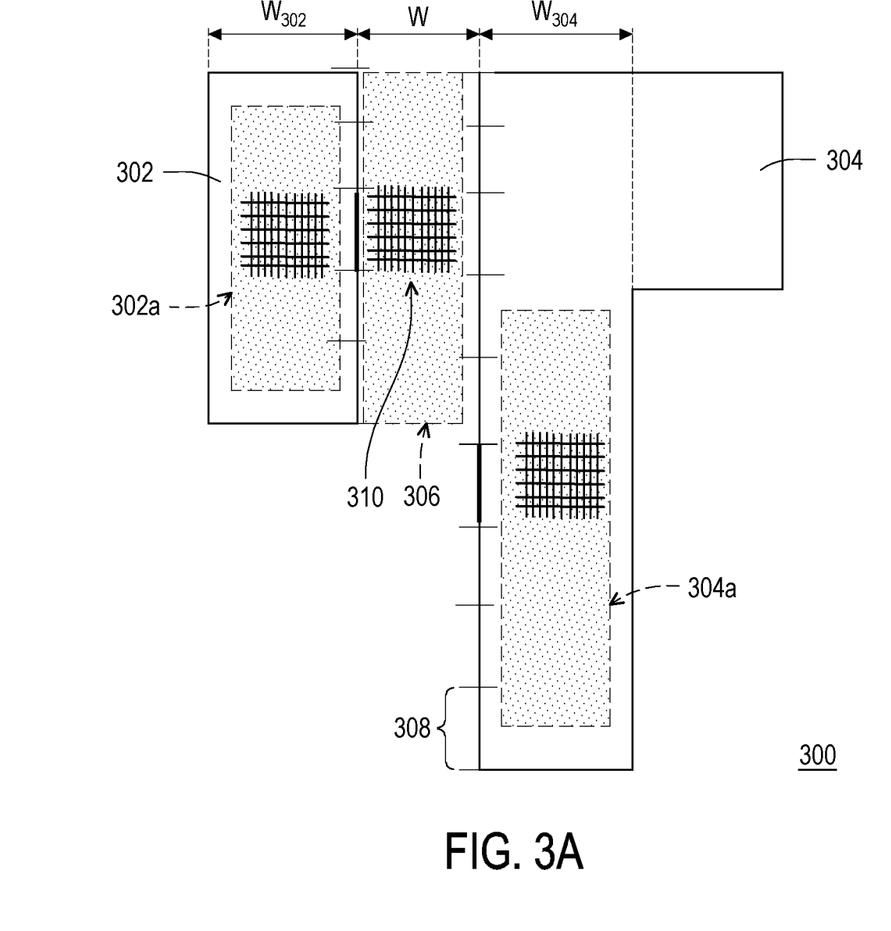
FIG. 3A is a schematic plan view illustrating a local region of target patterns.

At an operation S112, possible lithography weak regions in the target patterns are identified. In general, the target patterns may include patterns separated from each other. In the current step, lithography weak regions can be identified according to a width of each pattern and a width of a spacing between adjacent patterns. According to pre-established rules, if a width of a region in a pattern is less than a predetermined minimum width, this region is determined as a lithograph weak region. In addition, if a spacing width between adjacent patterns is less than a predetermined minimum spacing, the region between the two adjacent patterns is determined as a lithograph weak region. FIG. 3A is a schematic plan view of a local region of target patterns 300. Taking the target patterns 300 shown in FIG. 3A as an example, the target patterns 300 include target patterns 302 and 304 that are separated from each other. The target pattern 302 may have a width $W_{302}$, and the target pattern 304 may have a width $W_{304}$. Additionally, the target patterns 302 and 304 are laterally spaced from each other by a spacing width W. In the current operation, it is checked whether the width $W_{302}/W_{304}$ of each target pattern 302/304 is less than the predetermined minimum width and whether the spacing width W between adjacent target patterns 302 and 304 is less than a predetermined minimum spacing. For example, the width $W_{302}$ of the target pattern 302 may be less than the predetermined minimum width, and is determined to be a lithograph weak region 302a. Additionally, the target pattern 304 may include a lithography weak region 304a having the width $W_{304}$ that is less than a predetermined minimum width. Furthermore, when the spacing width W between the target patterns 302 and 304 is less than a predetermined minimum spacing, the region between the target patterns 302 and 304 is determined as a lithograph weak region 306.

If the check on the light intensities at the edges of the target pattern (the operation S108) is passed, the operation S110 may be skipped. In other words, the method may directly proceed to the operation S112 from the operation S108.

At an operation S114, light intensity curves of the lithography weak regions are obtained. Taking FIG. 3A as an example, before obtaining the light intensity curves of the lithograph weak regions 302a, 304a, 306, the contours of the target patterns 302 and 304 can be equally divided into multiple line segments 308. In addition, a simulation grid 310 (imaginary) for defining multiple simulation points is set in a range corresponding to each line segment 308 of each lithograph weak region 302a/304a/306. Each intersection of vertical lines and horizontal lines (both imaginary) of the simulation grid 310 defines a simulation point. A computer simulated light intensity at each simulation point is obtained according to input information including the light source, the photomask pattern, the position of the simulation point the surrounding conditions and the like. Light intensities corresponding to a row/column of the simulation points can be collected to form a light intensity curve. In other words, multiple light intensity curves can be obtained in corresponding to each line segment 308 in each lithography weak region 302a/304a/306. It should be understood that when the simulation grid 310 have more vertical lines and horizontal lines, the obtained light intensity curves are respectively formed of denser data points. On the other hand, reducing the number of the vertical lines and the horizontal lines of the simulation grid 310 can shorten the time for obtaining the light intensity curves. Those with ordinary knowledge in the art can adjust the number of the vertical lines and the horizontal lines of the simulation grid 310 according to process requirements, and the disclosure is not limited thereto.

Figure 3B:
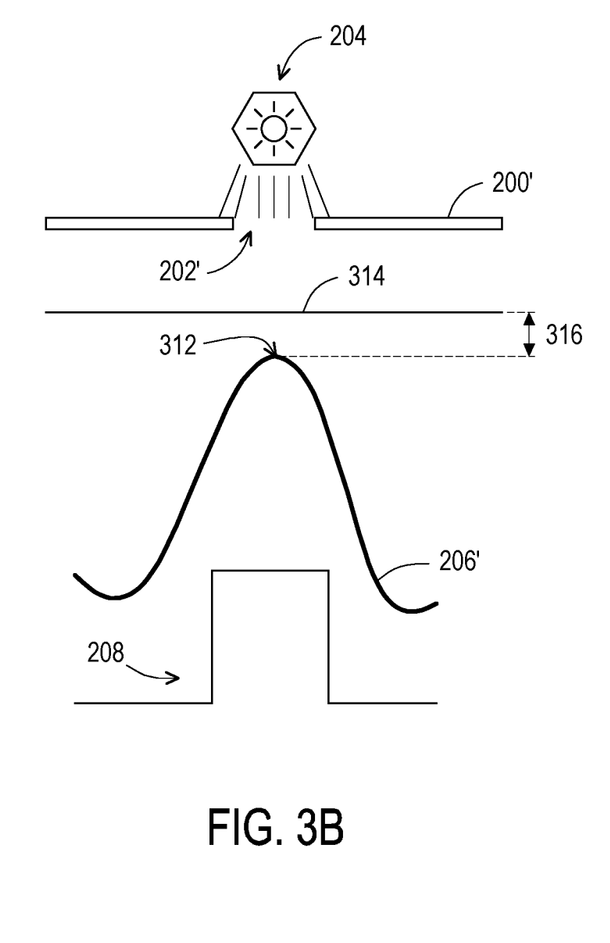
FIG. 3B illustrates a light intensity curve based on the corrected photomask pattern of FIG. 2B.

At an operation S116, a check on a peak light intensity is performed on each light intensity curve of each lithography weak region. Specifically, the check on the peak light intensity includes comparing a peak value of each light intensity curve corresponding to one of the lithography weak regions with a predetermined peak value, and defining a peak intensity error therebetween. The peak intensity error may indicate a lithography problem such as a problem that a spacing between two target patterns is too narrow and another problem that an individual target pattern is too narrow. FIG. 3B illustrates the light intensity curve 206' of FIG. 2B and the corresponding light source 204, the photomask pattern 200', and the target pattern 208. For example, if the target pattern 208 is regarded as a part of a lithograph weak region (e.g., the lithograph weak regions 302a/304a/306 described with reference to FIG. 3A) corresponding to a line segment (e.g., the line segment 308 described with reference to FIG. 3), the light intensity curve 206' represents a series of light intensities at a row/column of simulation points corresponding to the part of the lithograph weak region. The check on the peak light intensity includes comparing a peak value 312 of the light intensity curve 206' with a predetermined peak value 314. As shown in FIG. 3B, the peak value 312 of the light intensity curve 206' is lower than the predetermined peak value 314, and a difference between the two can be defined as a peak intensity error 316.

Figure 3C:
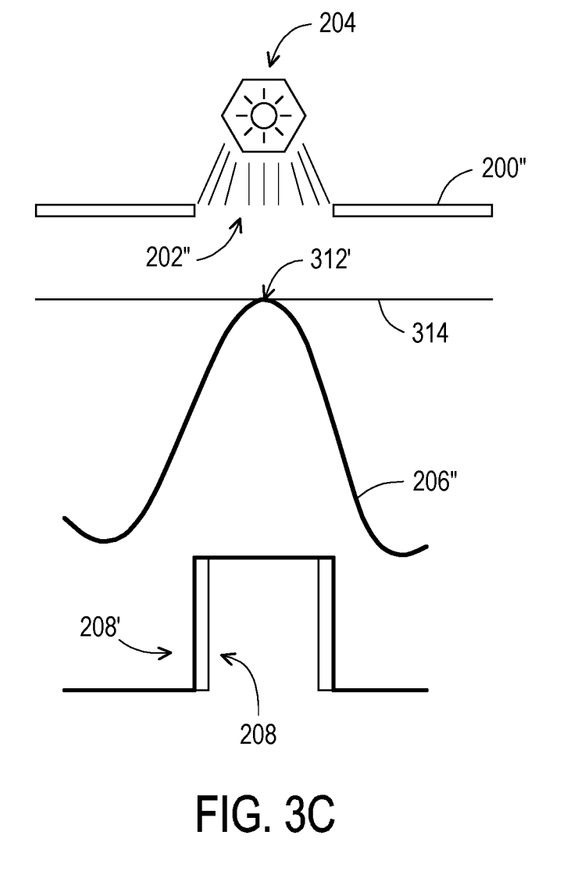
FIG. 3C illustrates a light intensity curve when the opening of the photomask in FIG. 3B becomes widened in accordance with extrapolation of the target pattern.

If the check on the peak light intensity is not passed, the target pattern is adjusted according to the check result of the peak light intensity at an operation S118. Next, at an operation S120, the photomask pattern is corrected according to the adjusted target pattern. Subsequently, at the operation S114, a light intensity curve is obtained according to the adjusted target pattern and the corrected photomask pattern. Since this adjustment of the target pattern is based on computer simulation results, it is a model-based retargeting process. Furthermore, the adjustment to the target pattern is performed locally for lithography weak regions in the target patterns rather than the adjustment to the entire target patterns. Taking FIG. 3B as an example, methods for reducing or eliminating the peak intensity error 316 may include extrapolating two opposite edges of the target pattern 208. In accordance with the extrapolation of the target pattern 208, the opening 202' of the photomask pattern 200' is then further enlarged, and this leads the light intensity curve 206' to be moved upward. The results are illustrated in FIG. 3C. The target pattern 208 shown in FIG. 3B is extrapolated to form a target pattern 208'. Correspondingly, the photomask pattern 200' is corrected into a photomask pattern 200" with a larger opening 202". Accordingly, the light intensity curve 206' is correspondingly moved upward to be a light intensity curve 206". The peak value 312' of the light intensity curve 206" may be close to or coincide with the predetermined peak 314. Meanwhile, the peak intensity error has been greatly reduced or eliminated. Once the peak intensity error is eliminated, the problem of lithography weak region caused by problems such as the problem that a width of a spacing between adjacent target patterns is too narrow or the problem that an individual target pattern is too narrow can be effectively solved.

If the peak intensity error is not eliminated yet, the cycle including the operations S118, S120, S114, and S116 may be repeated until the peak intensity error is fully eliminated. Meanwhile, the photomask pattern is already different from the photomask pattern corrected according to the check result of the light intensity at the pattern edges. Therefore, once the check on the peak light intensity at the operation S116 is passed (i.e., the peak intensity error is eliminated), return to the operations S108 and S110 to adjust the photomask pattern according to the check results of the light intensities at the pattern edges. Based on the once again corrected photomask pattern, the operations S112, S114, and S116 may be continued to determine whether the light intensity curves of the lithography weak region pass the check on the peak light intensity. If the check on the peak light intensity is not passed, the cycle including the operations S118, S120, S114, and S116 may be performed again. If the check on peak light intensity is passed, the process may return to the operation S108 once again. The above iterations are continued until the check on light intensities at the pattern edges and the check on peak light intensities at the lithography weak regions are both passed. After the iterations, the photomask pattern can be output. Since the design process of the photomask pattern includes retargeting for the lithography weak regions, there is no need to perform a step of lengthy photomask repair after completing the OPC iterations 102. As a result, the time required for photomask design can be greatly reduced.

Figure 4A:
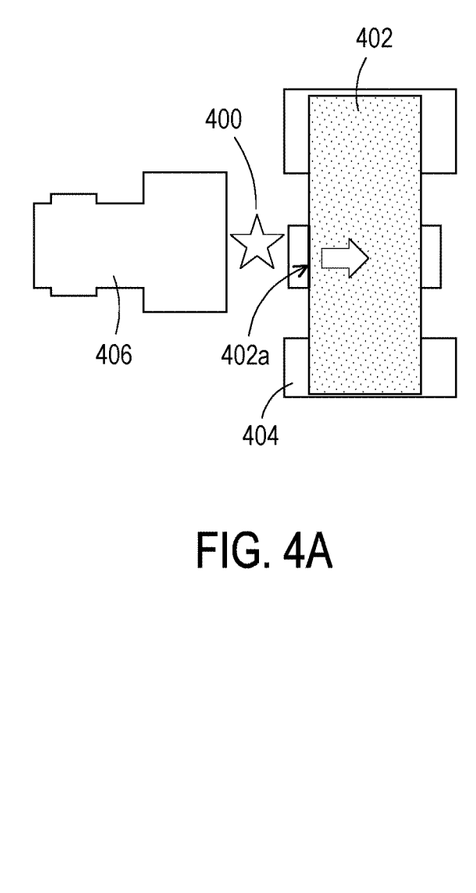
FIG. 4A to FIG. 4C illustrate a process of adjusting a target pattern and correcting a photomask pattern accordingly for eliminating a lithography weak region.
Figure 4B:
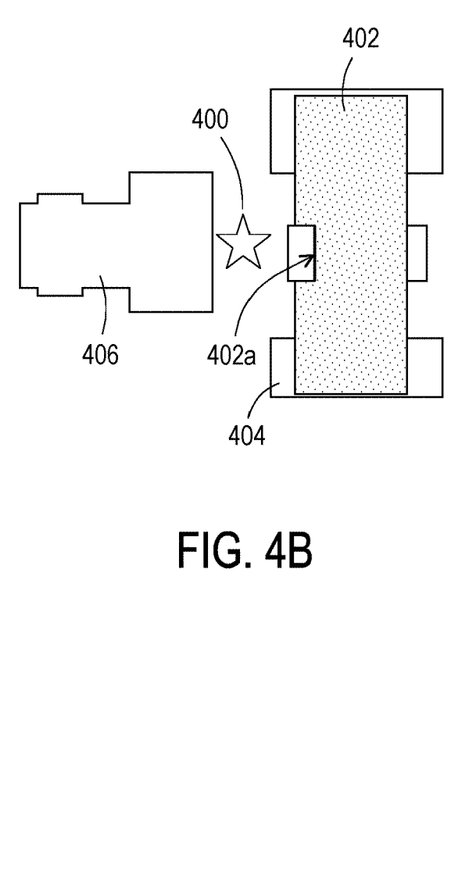
Figure 4C:
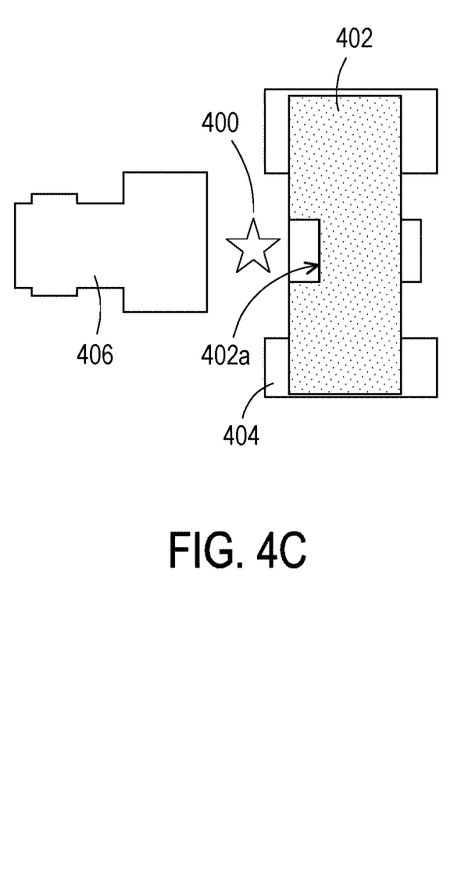

FIG. 4A to FIG. 4C illustrate the process of correcting a target pattern and a photomask pattern for a lithography weak region.

The cycle including the operations S118, S120, S114, and S116 shown in FIG. 1 may be performed multiple times to complete the adjustment of the target pattern and correction of the photomask pattern will be discussed with reference to FIG. 4A to FIG. 4C. Referring to FIG. 4A to FIG. 4C, the lithography weak region 400 may be a region between two adjacent target patterns (only a target pattern 402 of the two target patterns is illustrated), and the photomask patterns 404 and 406 at opposite sides of the lithography weak region 400 are designed based on these two patterns.

As shown in FIG. 4A, during a cycle, according to the check result of the peak light intensity, it is determined that a line segment 402a of the target pattern 402 requires to be retracted to reduce or eliminate the peak intensity error. FIG. 4B illustrates the result of retracting the line segment 402a of the target pattern 402. In addition, as shown in FIG. 4B, the photomask pattern 404 is retracted corresponding to the retraction of the target pattern 402. As shown in FIG. 4C, during a next cycle, it may still be determined that the peak intensity error has not been fully eliminated. For this, the gate pattern 402 and the photomask pattern 404 are further retracted. Although it is not illustrated, if the peak intensity error is still not eliminated, the cycle can be repeated until the peak intensity error is completely eliminated.

Figure 5:
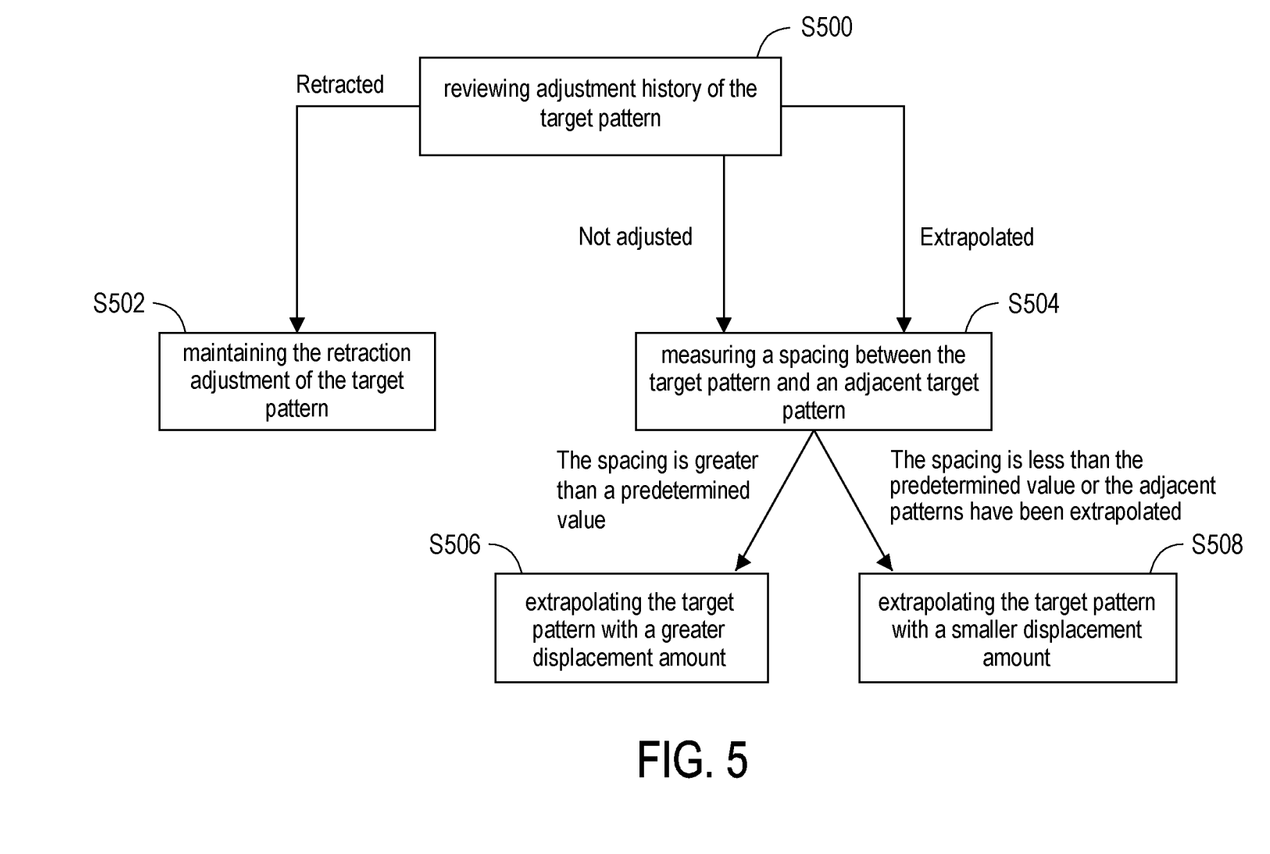
FIG. 5 is a flowchart illustrating how the pattern displacement amount is adjusted according to the adjustment history of the pattern and the retargeting direction of adjacent patterns before performing retargeting for a lithography weak region with a too narrow pattern width.

In some embodiments, the adjustment of the target pattern further takes into account adjustment history of the target pattern and whether adjustments of adjacent target patterns conflict with each other. FIG. 5 is a flowchart illustrating whether the pattern displacement amount requires adjustment according to adjustment history of the gate pattern and the retargeting directions of the adjacent target patterns before performing retargeting for the lithography weak region with a too narrow pattern width. Note that the operation shown in FIG. is after the operation S116 and before the operation S118 shown in FIG. 1.

In general, the solution to the problem of lithography weak region where the target pattern width is too narrow is to extrapolate the contour of the target pattern. However, such extrapolation may lead the spacing between adjacent target patterns to be too narrow. Similarly, if the contours of adjacent target patterns are both extrapolated, this may also lead to the problem of the spacing being too narrow. Therefore, the adjustment history of the target pattern and the retargeting directions of adjacent target patterns have to be taken into account.

Referring to FIG. 5, in an operation S500, adjustment history of the gate pattern to be adjusted is reviewed. Assuming that the target pattern has been retracted to increase a spacing between adjacent target patterns, it means that widening the target pattern may lead the spacing to be too narrow. Therefore, as shown in an operation S502, the original retraction adjustment may be maintained. On the other hand, if the gate pattern has been extrapolated or not any adjustment has been made, then proceed to an operation S504 to measure a spacing between the target pattern and an adjacent target pattern. If the spacing is greater than a predetermined value, the target pattern may be extrapolated with a larger displacement amount (as shown in an operation S506). On the other hand, if the spacing is less than the predetermined value or the adjacent patterns have been extrapolated, the gate pattern may be extrapolated with a smaller displacement amount (an operation S508). By further taking into account the adjustment history of the target pattern and whether the adjustments of adjacent target patterns conflict with each other, the retargeting of the target pattern can be optimized, which can improve and/or facilitate the design process of the photomask.

As above, in the embodiments of the disclosure, a method for forming a photomask is provided. In the method, an OPC iterations each including a model-based photomask pattern correction and a model-based target pattern adjustment is performed. The model-based photomask pattern correction is used for ensuring each part of the photomask pattern to be individually matched with the corresponding contour of the target pattern (on target). On the other hand, the model-based target pattern adjustment is used to solve the problem of lithography weak region caused by adjacent target patterns being too close together or the target pattern width being too narrow. As a result, the photomask repair after the OPC iterations to resolve the problem of lithography weak region is no longer required. In addition, the model-based target pattern adjustment is to correct the target pattern according to the difference between the peak value of the simulated light intensity curve of the lithography weak region and the predetermined peak value. Accordingly, the model-based target pattern adjustment can be accomplished by computer simulation and is aimed at the local lithography weak region in the target patterns rather than the entire target patterns. Therefore, the time required for designing the photomask can be greatly shortened.

What is claimed is:

1. A method for forming a photomask, comprising:
providing a photomask pattern according to a target pattern;
simulating a first light intensity curve according to the photomask pattern;
subjecting the first light intensity curve to a check on light intensities at pattern edges of the target pattern to define a light intensity error, wherein the light intensity error is a difference between the light intensities of the first light intensity curve corresponding to the pattern edges of the target pattern and a predefined standard light intensity;
correcting the photomask pattern to reduce the light intensity error;
identifying a lithography weak region in the target pattern;
obtaining a second light intensity curve of the lithography weak region by simulation;
subjecting the second light intensity curve to a check on peak light intensity to define a peak intensity error, wherein the peak intensity error is a difference between a peak value of the second light intensity curve and a predetermined peak value;
retargeting the target pattern to reduce the peak intensity error; and
re-correcting the photomask pattern according to the retargeted target pattern.

2. The method for forming a photomask according to claim 1, further comprising repeatedly performing a cycle including steps of simulating the first light intensity curve, performing the check on the light intensities at the pattern edges of the target pattern, correcting the photomask pattern to reduce the light intensity error, identifying the lithography weak region in the target pattern, obtaining the second light intensity curve by simulation, performing the check on peak light intensity, retargeting the target pattern to reduce the peak intensity error, and re-correcting the photomask pattern according to the retargeted target pattern until the light intensity error and the peak intensity error are eliminated.

3. The method for forming the photomask according to claim 2, further comprising outputting the photomask pattern after repeatedly performing the cycle until the light intensity error and the peak intensity error are eliminated.

4. The method for forming the photomask according to claim 2, further comprising retargeting the target pattern based on pre-established rules before performing the cycle for multiple times.

5. The method for forming the photomask according to claim 2, wherein the step of retargeting the target pattern in each cycle comprises altering a displacement amount of the target pattern based on the retargeting of the target pattern in a previous cycle.

6. The method for forming the photomask according to claim 1, wherein the lithography weak region in the target pattern is identified based on pre-established rules.

7. The method for forming the photomask according to claim 6, wherein the lithography weak region comprises a pattern in the target pattern having a width less than a predetermined width or a region between adjacent patterns in the target pattern that has a spacing width less than a predetermined spacing width.

8. The method for forming the photomask according to claim 1, wherein obtaining the second light intensity curve of the lithography weak region by simulation comprises:
setting a simulation grid in the lithography weak region; and
obtaining light intensities at simulation points defined by intersections of vertical lines and horizontal lines of the simulation grid by simulation.

9. The method for forming the photomask according to claim 1, wherein the target pattern is retargeted and the photomask pattern is corrected according to the retargeted target pattern so that the second light intensity curve is moved upward or downward.

10. The method for forming the photomask according to claim 1, wherein retargeting the target pattern to reduce the peak intensity error is a model-based target pattern retargeting.

11. A method for forming a photomask, comprising:
performing a cycle for many times until a check on a light intensity at pattern edges and a check on a peak light intensity of a simulated light intensity curve for a lithography weak region in a target pattern are both passed, wherein each cycle comprises performing a model-based photomask correction and a model-based target pattern retargeting, the model-based target pattern retargeting comprises performing the check on the peak light intensity of the simulated light intensity curve for the lithography weak region in the target pattern, the check on the peak light intensity defines a peak intensity error, the peak intensity error is a difference between a peak value of the light intensity curve and a predetermined peak value, and the model-based target pattern retargeting results in a reduction of the peak intensity error.

12. The method for forming the photomask according to claim 11, wherein the model-based photomask correction is performed in each cycle such that a photomask pattern designed for the target pattern is corrected to have each part being matched with a corresponding contour of the target pattern in terms of lithography.

13. The method for forming the photomask according to claim 12, wherein the photomask pattern is no longer repaired for eliminating the lithography weak region after performing the cycle for multiple times.

14. The method for forming the photomask according to claim 11, wherein the model-based target pattern retargeting is performed to solve a problem of the lithography weak region caused by a pattern width in the target pattern being less than a predetermined width and/or a spacing between adjacent patterns being less than a predetermined spacing width.

* * * * *